(12) United States Patent
Yamada et al.

(10) Patent No.: US 6,400,638 B1
(45) Date of Patent: Jun. 4, 2002

(54) WORDLINE DRIVER FOR FLASH MEMORY READ MODE

(75) Inventors: Shigekazu Yamada; Takao Akaogi; Colin S. Bill, all of Cupertino, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/680,344

(22) Filed: Oct. 5, 2000

Related U.S. Application Data

(60) Provisional application No. 60/184,873, filed on Feb. 25, 2000.

(51) Int. Cl.[7] .................................................. G11C 8/00
(52) U.S. Cl. ................... 365/230.06; 365/226; 365/211
(58) Field of Search ........................... 365/230.06, 191, 365/104, 226, 211

(56) References Cited

U.S. PATENT DOCUMENTS 5,455,789 A  * 10/1995 Nakamura et al. ..... 365/185.17
5,872,734 A    2/1999 Tanaka et al. ......... 365/185.24
5,912,838 A    6/1999 Chevallier ............. 365/185.03
5,917,757 A    6/1999 Lee et al. .............. 365/185.33

FOREIGN PATENT DOCUMENTS

EP          0602355 A1     6/1994   ............. G05F/1/46

* cited by examiner

Primary Examiner—David Nelms
Assistant Examiner—Thong Le

(57) ABSTRACT

The present invention discloses a wordline voltage regulation method and system that provides a predetermined voltage as a wordline voltage to a plurality of wordlines during read mode. A supply voltage (Vcc) is regulated and temperature compensated by a wordline driver circuit to provide the predetermined voltage that is lower in magnitude than the magnitude of the supply voltage (Vcc). The wordline driver circuit is activated by an activation circuit when the read operation is initiated. During the read operation, the wordline driver circuit maintains the predetermined voltage during variations in the supply voltage (Vcc) as well as variations in a process load supplied by the wordline driver circuit.

17 Claims, 3 Drawing Sheets

WORDLINE DRIVER FOR FLASH MEMORY READ MODE

This application claims the benefit under 35 U.S.C. §119(e) of Provisional U.S. patent application Ser. No. 60/184,873, filed on Feb. 25, 2000.

FIELD OF INVENTION

The present invention relates generally to non-volatile memory devices and, more particularly, to a method and system of wordline voltage regulation in flash electrically erasable programmable read-only memory (EEPROM) devices.

BACKGROUND OF THE INVENTION

Flash memories are popular memory storage devices because they store information in the absence of continuous power and are capable of being constructed in a very compact form. Flash memory is typically constructed by fabricating a plurality of floating-gate transistors in a silicon substrate. A floating-gate transistor is capable of storing electrical charge on a separate gate electrode, known as a floating gate that is separated by a thin dielectric layer from a control-gate electrode. Generally speaking, data is stored in a non-volatile memory device by the storage of an electrical charge in the floating gate.

In a flash EEPROM device, electrons are transferred to the floating-gate electrode through a thin dielectric layer, known as a tunnel-oxide layer, located between the floating-gate electrode and an underlying substrate. Typically, the electron transfer is carried out by channel hot electron ("CHE") injection or Fowler-Nordheim tunneling. In either electron transfer mechanism, a voltage is coupled to the floating-gate electrode by a control-gate electrode. The control-gate electrode is capacitively coupled to the floating-gate electrode, such that a voltage applied to the control-gate electrode is coupled to the floating-gate electrode. In one type of device, the control-gate electrode is a polycrystalline silicon-gate electrode overlying the floating-gate electrode and separated therefrom by the thin dielectric layer. In another type of device, the floating-gate electrode is a doped region in the semiconductor substrate.

Flash memory is formed by rows and columns of flash transistors, with each transistor being referred to as a cell that includes a control gate, a drain and a source. A wordline decoder provides operational voltages to rows of transistors in each sector of the memory device and is typically connected with the control gate of each transistor in a sector. A bitline decoder provides operational voltages to columns of transistors and is typically connected to the drains of the transistors in each column. Generally, the sources of the transistors are coupled to a common sourceline and are controlled by a sourceline controller.

A cell is typically programmed by applying a predetermined voltage to the control gate, a second predetermined voltage to the drain, and grounding the source. This causes channel hot electrons to be injected from the drain depletion region into the floating gate. A cell can be erased several ways in a flash memory device. In one arrangement, a cell is erased by applying a predetermined voltage to the source, grounding the control gate and allowing the drain to float. This causes the electrons that were injected into the floating gate during programming to be removed by Fowler-Nordheim tunneling from the floating gate through the thin tunnel oxide layer to the source.

Cells are typically read during a read operation by applying a predetermined voltage to the control gate via a wordline, a second predetermined voltage to the bitline, to which the drain is connected, grounding the source, and then sensing the bitline current. If the cell is programmed and a threshold voltage is relatively high, the bitline current will be zero or relatively low. If the cell is not programmed or erased, the threshold voltage will be relatively low, the predetermined voltage on the control gate will enhance the channel and the bitline current will be relatively high.

Known problems occur during the read operation when a voltage applied to the wordline is not within a predetermined voltage range. If the voltage applied to the wordline decoder is too high, the cells on that wordline can be physically damaged or there can be a disturbance of the threshold voltage of the cells. In addition, applying a voltage that is too high can also cause data retention failure within the cells. High voltages on the wordline can also affect the endurance of the cells on a given wordline. If the wordline voltage is too low, insufficient bitline current may be developed to properly read a cell on the wordline.

Presently known methods of supplying voltage to the wordlines during the read operation use a supply voltage (Vcc) that is the power supply for the flash memory. As flash memory technology has advanced, and smaller technologies have been developed (0.25 micron process, for example), the acceptable magnitude of voltage allowed to be supplied to the wordlines during a read operation has been reduced. As such, the supply voltage (Vcc) necessary to operate the flash memory can no longer be directly applied to the wordlines without experiencing the problems associated with high wordline voltages as set forth above.

Another known problem with applying the wordline voltage necessary to perform the read operation exists because of the changes in the operating temperature of the flash memory. As the operating temperature of the flash memory changes, so do the wordline voltage often drifts during a read operation. Due to advances in the technology, the range of voltage required on the wordlines to perform the read operation has become narrower. Presently known methods of providing wordline voltages during read mode do not provide high-speed capabilities when the flash memory is accessed during the read operation, thereby slowing the access time of these memory devices.

To that end, due to the further miniaturization of microchips, a need exists for a method of wordline voltage regulation that provides a temperature-compensated predetermined output voltage that is less than the supply voltage (Vcc) during a read operation.

SUMMARY OF THE INVENTION

The present invention discloses a method and system of wordline voltage regulation in a flash memory that overcomes the problems caused by the further miniaturization of flash memories. The preferred flash memory includes a wordline driver circuit that regulates a supply voltage (Vcc) to provide a predetermined temperature-compensated wordline voltage that can be applied to a plurality of wordlines during a read operation. The wordline driver circuit is capable of reducing the magnitude of voltage available on the supply voltage (Vcc) to a level that is acceptable to perform read operations in the flash memory.

The present invention discloses a method of supplying a predetermined read voltage when a flash memory device is in read mode. In the preferred embodiment of the invention, a plurality of control signals are generated with an activation circuit, in response to control signals received by a state machine. The control signals are directed to a wordline driver circuit, which generates a predetermined read voltage using a supply voltage connection in response to the control signals. In the preferred embodiment, the wordline driver circuit reduces the voltage level from the magnitude of voltage present on the supply voltage connection with the wordline driver circuit. After being reduced, the predetermined read voltage is supplied to at least one wordline in the flash memory device during the read operation.

In the preferred embodiment of the invention, the wordline driver circuit generates the predetermined read voltage using a chain of resistors and a current mirror. The wordline driver circuit adjusts for variations in the voltage level on the supply voltage connection to maintain the predetermined read voltage at acceptable levels. In the present preferred embodiment, the predetermined read voltage is maintained between approximately 3.7–4.5 V when the voltage level on the supply voltage connection is operating between approximately 4.5–5.5 V. The wordline driver circuit regulates the voltage on the supply voltage connection to the predetermined read voltage within ten nanoseconds once the activation circuit is activated by the state machine.

Another preferred embodiment of the present invention discloses a method of regulating a supply voltage in a memory device that is operating in read mode. In this embodiment, the supply voltage is supplied to a wordline driver circuit within the flash memory device. The wordline driver circuit is activated with an activation circuit when the memory device is in read mode. Once activated, the supply voltage is regulated to a predetermined read voltage with the wordline driver circuit. After the predetermined read voltage is regulated to a predetermined level, the predetermined read voltage is supplied to at least one wordline in the flash memory device.

Another preferred embodiment of the present invention discloses a wordline voltage regulation system for use during read mode in a flash memory device. The voltage regulation system includes an activation circuit electrically connected with a state machine. The state machine controls the activation circuit with a plurality of control signals that are connected to the activation circuit using a plurality of control lines. A wordline driver circuit is electrically connected to the activation circuit. The wordline driver circuit regulates the voltage on the supply voltage connection to a predetermined read voltage in response to a signal from the activation circuit. At least one wordline is electrically connected with the wordline driver circuit, which provides the predetermined read voltage to at least one wordline during read mode.

The preferred embodiments of the present invention disclose methods and systems that quickly and accurately provide a predetermined read voltage to wordlines in a flash memory device during read mode. The present invention overcomes the problems created with reduced transistor sizes, such as 0.25 um transistor sizes, and the exposure of these transistors that make up the memory cells in wordlines to voltage levels that may disturb the data stored in these memory cells. The present invention discloses a wordline driver circuit that can provide a reduced predetermined read voltage to wordlines in a flash memory device within 10 nanoseconds of activation that will not disturb the data stored on the memory cells in the wordlines. As such, the present invention solves the problems created by applying voltage levels that are to high on the wordlines during read mode in a flash memory device.

These and other features and advantages of the invention will become apparent upon consideration of the following detailed description of the presently preferred embodiments of the invention, viewed in conjunction with the appended drawings.

DETAILED DESCRIPTION OF THE INVENTION

The exemplary embodiments of the invention are set forth below with reference to specific configurations, and those skilled in the art would recognize that various changes and modifications could be made on the specific configurations while remaining within the scope of the claims. The invention may be used with any type of memory device; however, the preferred embodiment of the invention is designed for a flash memory. All electrical parameters are given by example only and can be modified to be used with various memory devices using other electrical parameters. For example, in the preferred embodiment, a supply voltage (Vcc) is considered as 5.0 V, but could alternatively be 3.3 V, 1.8 V or some other supply voltage. If a different supply voltage is chosen, the various operational levels would be modified to accommodate the different supply voltage, as known in the art. In addition, as those skilled in the art would recognize, often the supply voltage (Vcc) often drifts between voltage ranges during operation due to load and various other operating parameters.

Figure 1:
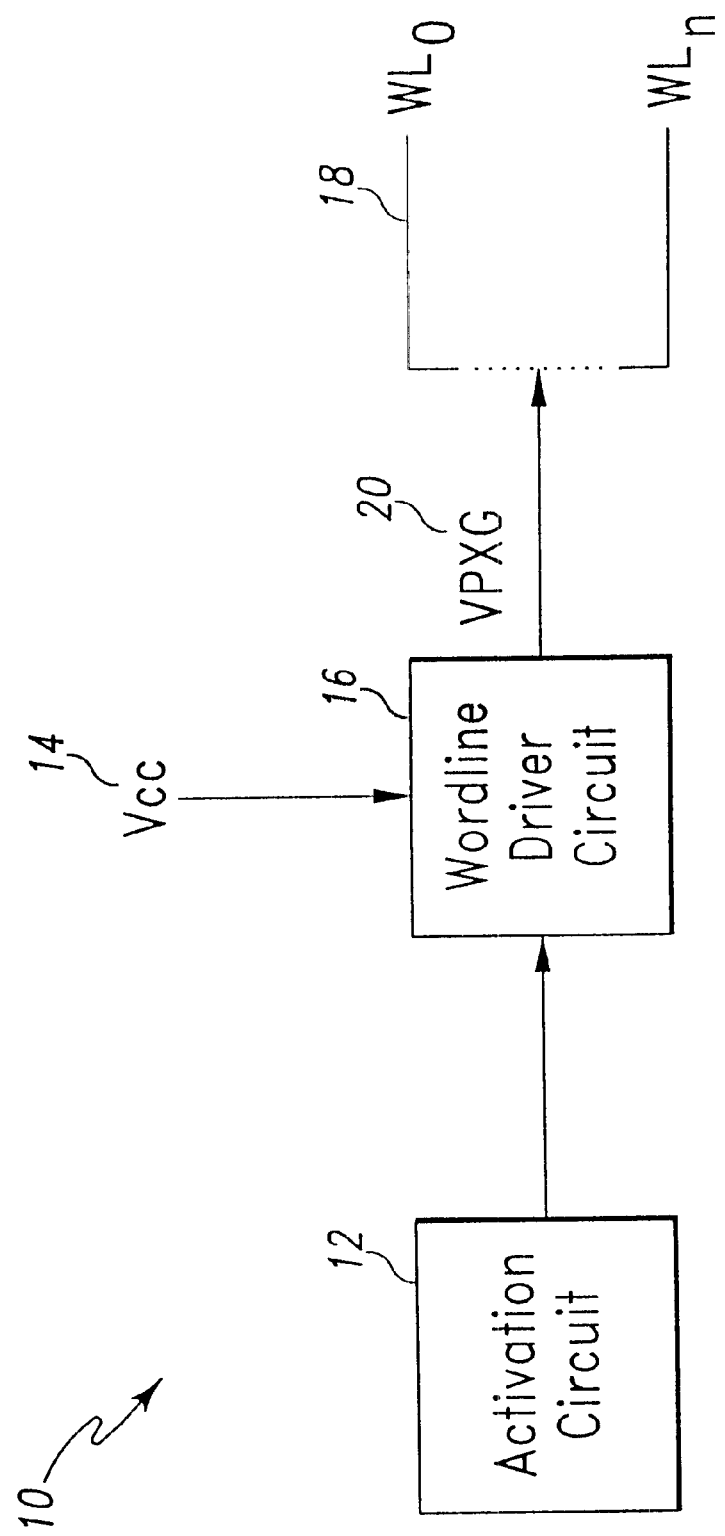
FIG. 1 represents a block diagram of a portion of a preferred flash memory incorporating a preferred embodiment of the invention.

FIG. 1 illustrates a portion of a preferred flash memory 10 incorporating an embodiment of the present invention. The flash memory 10 includes a wordline activation circuit 12, a supply voltage connection (Vcc) 14, a wordline driver circuit 16 and a plurality of wordlines 18. In the preferred embodiment of the present invention, the wordline activation circuit 12 is electrically connected with the wordline driver circuit 16. The supply voltage connection (Vcc) 14 is also electrically connected with the wordline driver circuit 16 and supplies the wordline driver circuit 16 with electrical energy that is applied to the wordlines 18 during the read operation. The wordline driver circuit 16 is electrically connected with the wordlines 18 in the flash memory 10. As set forth above, the wordline driver circuit 16 is used to generate the predetermined read voltage that is applied to respective wordlines 18 during a read operation in the flash memory 10.

In the preferred embodiment of the present invention, the wordline activation circuit 12 receives control signals from a state machine (not shown) when the read operation is being performed by the flash memory 10. As known in the art, state machines are used to control the overall operation of flash memory 10 in response to instruction sets that are received by the state machine. In the preferred embodiment, it is only necessary to understand that the state machine generates predetermined control signals that are directed to the wordline activation circuit 12 when the read operation occurs in the flash memory 10.

When the wordline activation circuit receives the control signals from the state machine, the wordline activation circuit 12 generates predetermined electric signals that are sent to the wordline driver circuit 16. In the preferred embodiment of the present invention, the wordline driver circuit 16 is electrically connected with the supply voltage connection (Vcc) 14, which can vary in voltage magnitude from 4.5V–5.5V. As previously set forth, those skilled in the art would recognize that during operation, the voltage level on the supply voltage connection (Vcc) 14 can fluctuate due to load conditions as well as various other operating parameters.

During operation, the wordline driver circuit 16 reduces the supply voltage (Vcc) 14 to a predetermined read threshold voltage level which, in the preferred embodiment, is between 3.7V–4.5V. As previously set forth, the wordline driver circuit 14 is electrically connected with respective wordlines 18 in the flash memory 10. In particular, a read voltage output line (VPXG) 20 is used to electrically connect the output of the wordline driver circuit 16 to the wordlines 18. The predetermined read threshold voltage level that is generated on the read voltage output line (VPXG) 20 of the wordline driver circuit 16 represents a voltage that is lower in magnitude than the magnitude of voltage present on the supply voltage connection (Vcc) 14. The magnitude of the read threshold voltage that is available on the read voltage output line (VPXG) 20 is a voltage level that is appropriate for introduction to the wordlines 18 without causing damage to the core cells when the flash memory 10 is performing a read operation.

In the preferred embodiment of the present invention, the wordline 18 voltage level is maintained at optimal voltage operation levels by the wordline driver circuit 16 during variations in the supply voltage (Vcc) that is available on the supply voltage connection (Vcc) 14. Once regulated by the wordline driver circuit 16, the predetermined read threshold voltage that is generated by wordline driver circuit 16 is passed on the read voltage output line (VPXG) 20 to respective wordlines 18 of the flash memory 10. Those skilled in the art would recognize that decoders are used to direct the predetermined read threshold voltage that is passed from the read voltage output line (VPXG) 20 to the wordlines 18. For purposes of the present invention, it is sufficient to understand that the predetermined read threshold voltage that is generated on the read voltage output line (VPXG) 20 of the wordline driver circuit 16 is directed to the wordlines 18 during read operations.

Figure 2:
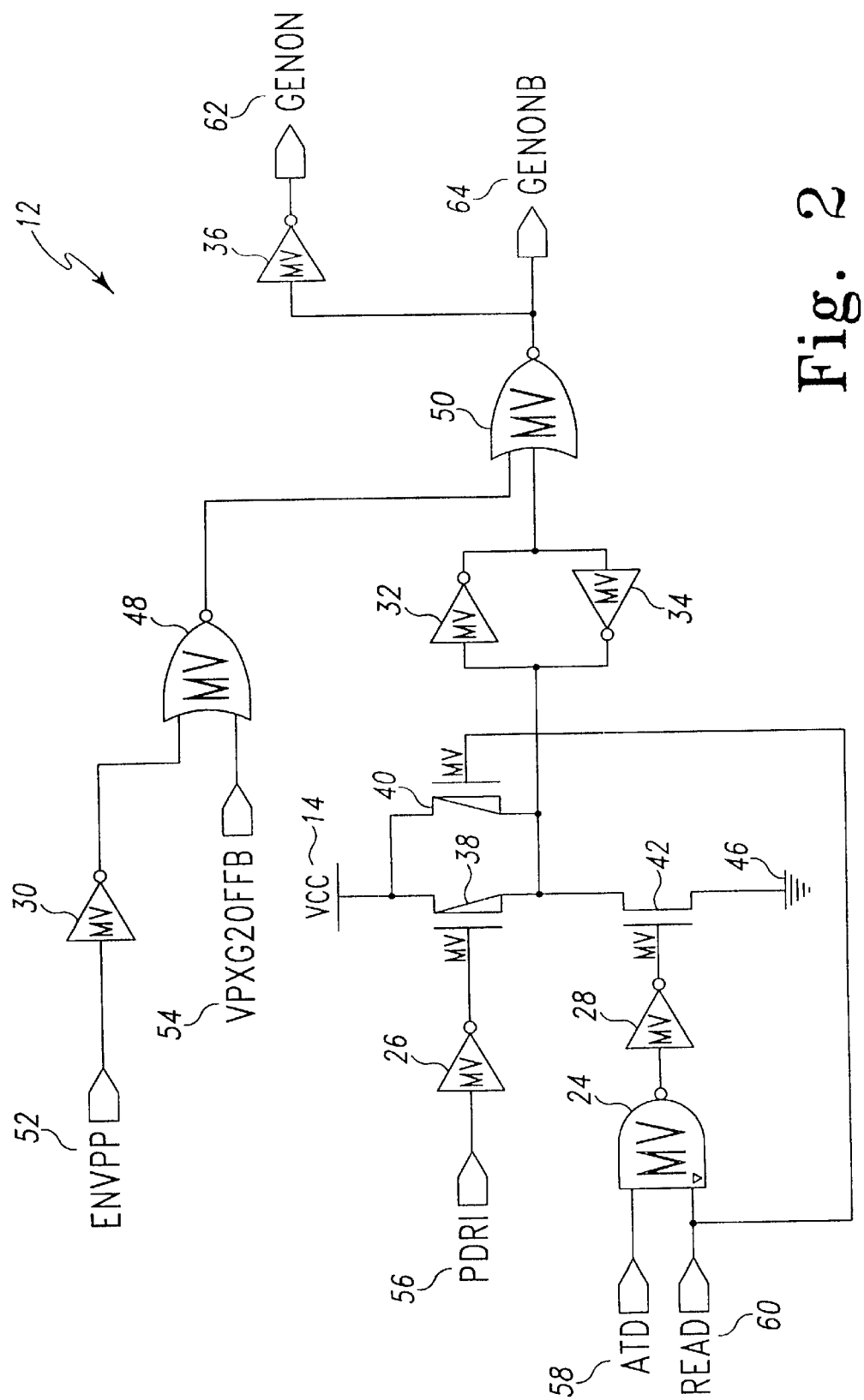
FIG. 2 is a circuit schematic of the preferred activation circuit of the present invention.

FIG. 2 is a circuit schematic of the preferred wordline activation circuit 12 used in the present disclosed embodiment of the flash memory 10. The preferred activation circuit 12 includes a NAND gate 24, a plurality of inverters 26–36, a plurality of p-channel transistors 38–40, an n-channel transistor 42, a ground connection 46 and a plurality of NOR gates 48–50 that are electrically connected as illustrated in FIG. 2. When the preferred flash memory 10 is performing a read operation, the wordline activation circuit 12 receives predetermined output signals from the state machine. As known to those skilled in the art, state machines control the overall operation of flash memory devices through the use of various logic circuits that are beyond the scope of the present invention.

The predetermined control signals that are generated by the state machine are received by the wordline activation circuit 12 on a pump enable line (ENVPP) 52, a source off line (VPXG2OFFB) 54, a CAM enable line (PDRI) 56, an address transition detector line (ATD) 58 and a READ line 60. Referring to FIG. 2, the address transition detector line (ATD) 58 and the READ line 60 are electrically connected to NAND gate 24. The CAM enable line (PDRI) 56 is electrically connected to inverter 26 and the pump enable line (ENVPP) 52 is electrically connected to inverter 30. The source off line (VPXG2OFTB) 54 is electrically connected to NOR gate 48. Transistor 38 and transistor 40 are also connected to the supply voltage connection (Vcc) 14. As those skilled in the art would recognize, the predetermined output signals that are directed to the wordline activation circuit 12 determine the logic states that are generated on a first generate on line (GENON) 62 and a second generate on line (GENONB) 64, which represent the output lines of the wordline activation circuit 12 that are electrically connected to the wordline driver circuit 16.

During operation of the flash memory 10, the wordline activation circuit 12 activates the wordline driver circuit 16 by providing electrical signals on the first generate on line (GENON) 62 and the second generate on line (GENONB) 64. The first generate on line (GENON) 62 and the second generate on line (GENONB) 64 are electrically connected to the wordline driver circuit 16. The electrical signals provided on the first generate on line (GENON) 62 and the second generate on line (GENONB) 64 are provided from the output of NOR gate 50. When the output of NOR gate 50 stops conducting (logic "0"), the first generate on line (GENON) 62 begins conducting (logic "1") and the second generate on line (GENONB) 64 stops conducting (logic "0") thereby activating the wordline driver circuit 16. Likewise, when the output of NOR gate 50 begins conducting (logic "1"), the first generate on line (GENON) 62 stop conducting (logic "0") and the second generate on line (GENONB) 64 begins conducting (Logic "1"), thereby deactivating the wordline driver circuit 16.

Figure 3:
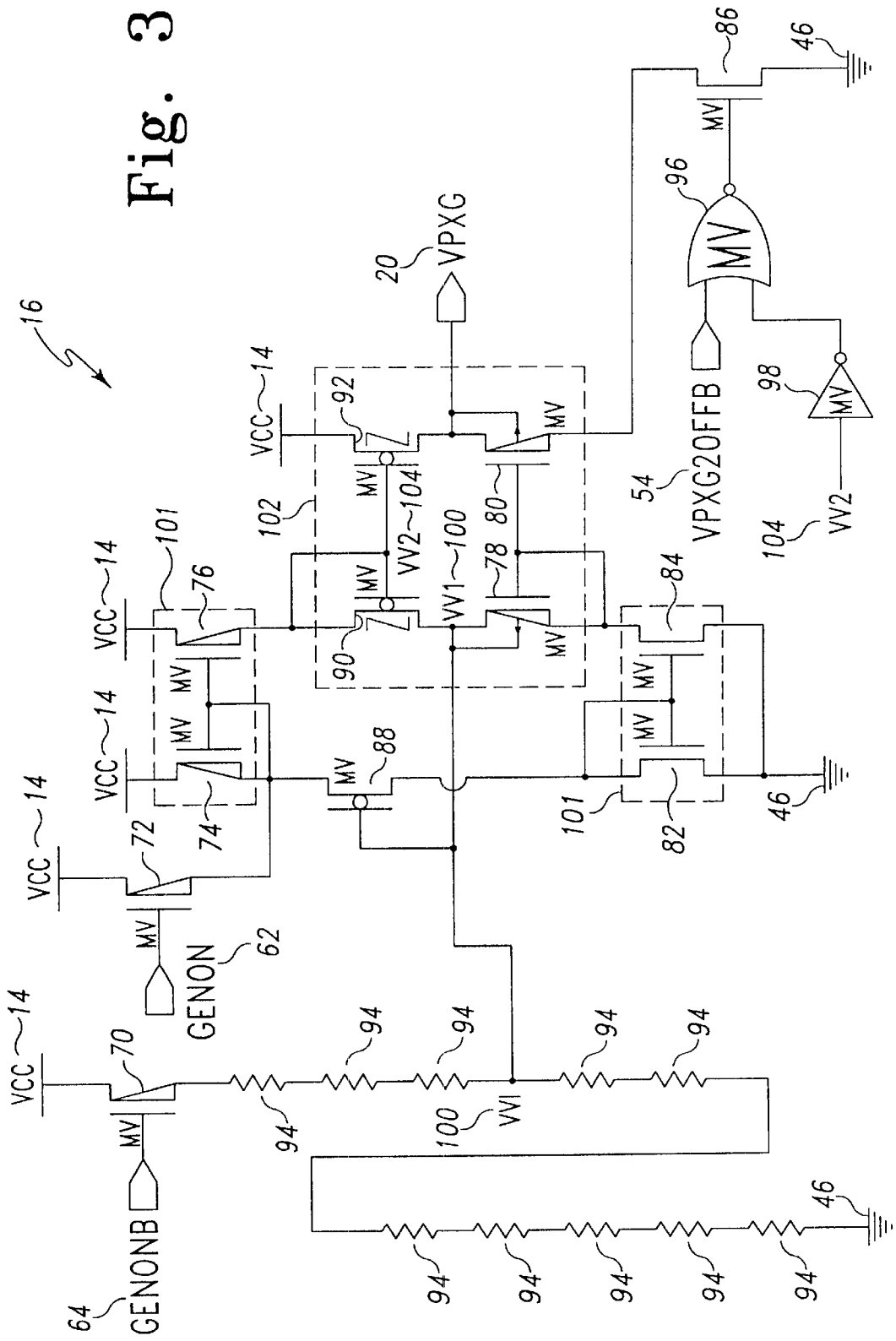
FIG. 3 is a circuit schematic of the preferred wordline driver circuit of the present invention.

FIG. 3 depicts a circuit schematic of the preferred wordline driver circuit 16 used in the flash memory 10. The preferred wordline driver circuit 16 includes a plurality of p-channel transistors 70–80, a plurality of n-channel transistors 82–86, a low threshold n-channel transistor 88, a plurality of low threshold n-channel transistors 90–92, a plurality of resistors 94 and a NOR gate 96 that are electrically connected as illustrated in FIG. 3. As illustrated, p-channel transistors 70, 72, 74, 76 and low threshold n-channel transistor 92 are electrically connected to the supply voltage connection (Vcc) 14. In addition, a select resistor 94 and n-channel transistors 82, 84 and 86 are electrically connected with the ground connection 46. As further illustrated, the resistors 94 are electrically connected in series and transistors 78, 88 and 90 are electrically connected between a predetermined pair of resistors 94. Those skilled in the art would recognize that resistors 94 make up a voltage divider that reduces the voltage level present from the supply voltage connection (Vcc) 14 at each stage.

In the preferred embodiment, the resistors 94 are made of p-channel resistors in a ratio. The p-channel resistors eliminate the process variation of each other during operation. As such, the operating temperature of the flash memory 10 does not affect the voltage drop across the resistors 94. For miniaturized flash memory 10, especially those designed using 0.25 $\mu$m transistor-size technology, the voltage applied to the wordlines 18 during read mode needs to be lower than the magnitude of voltage supplied by the supply voltage connection (Vcc) 14. In addition, the voltage level applied to the wordlines 18 needs to adjust to changes in the voltage level of the supply voltage connection (Vcc) 14. The chain of resistors 94 therefore provides a quick method of reducing the voltage on the supply voltage connection (Vcc) 14 to an acceptable level.

The chain of resistors 94 compensate for changes in operating conditions and varies the voltage level that is supplied to the wordlines 18 during read mode when various operating parameters vary. In the preferred embodiment, the wordline driver circuit 16 reduces the voltage level of the supply voltage connection to 82 percent of the original voltage level. As such, as the magnitude of voltage varies on the supply voltage connection (Vcc) 14 from approximately 4.5–5.5 V, the voltage level output of the wordline driver circuit will vary from approximately 3.7–4.5 V. Those skilled in the art would recognize that the resistive values of the resistor 94 and the number of resistors 94 could vary and that the percentage of voltage reduction will vary with the changes in resistive values and the number of resistors 94.

During operation, when the wordline driver circuit 16 is activated by the activation circuit 12, the second generate on line (GENONB) 64 stops conducting (logic "0") thereby energizing transistor 70, which completes a current path for the voltage supplied from the supply voltage connection (Vcc) 14 to flow through the resistors 94. The resistors 94 are configured to create and maintain the predetermined read threshold voltage at a first circuit node (VV1) 100. As set forth above, the magnitude of voltage at the first circuit node (VV1) 100 represents a ratio of the supply voltage (Vcc) 14 based on the resistive makeup of the chain of resistors 94 and the voltage variations in the supply voltage connection (Vcc) 14. During operation, the voltage at the first circuit node (VV1) 100 controls the activation of low threshold n-channel transistor 88, which is electrically connected to the resistors 94 at the first circuit node (VV1) 100. In turn, low threshold n-channel transistor 88 controls the operation of p-channel transistors 74, 76 and n-channel transistors 82, 84. P-channel transistors 74, 76 and n-channel transistors 82, 84 make up two switching circuits 101 that are capable of creating a current path for low threshold transistor 90 and p-channel transistor 78 in response to predetermined input signals.

As previously set forth, when the wordline driver circuit 16 is activated by the activation circuit 12, the first generate on line (GENON) 62 begins conducting (logic "1") thereby de-energizing transistor 72. This causes p-channel transistor 74 and p-channel transistor 76 to become energized thereby creating a current path to low threshold n-channel transistor 90 and n-channel transistors 82, 84. A current mirror 102 is created by the electrical connections of low threshold n-channel transistors 90, 92 and p-channel transistors 78, 80 as illustrated in FIG. 3. P-channel transistors 70, 72, 74, 76 and low threshold n-channel transistor 92 are also electrically connected to the supply voltage connection (Vcc) 14. The current mirror 102 is used to produce the predetermined read threshold voltage that is supplied to the wordlines 18 on the read voltage output line (VPXG) 20 during operation. As those skilled in the art would recognize, the current mirror 102 reflects the voltage generated on the first voltage node (VV1) 100 to the read voltage output line (VPXG) 20, where it is then connected with the wordlines 18. Due to the operating characteristics of the current mirror 102, the magnitude of voltage reflected on the read voltage output line (VPX6) 20 is slightly lower than that available at the first voltage node (VV1) 100.

Referring to FIG. 3, NOR gate 96 is electrically connected to a second voltage node (VV2) 104 via inverter 98, the source off line (VPXG2OFFB) 54 and n-channel transistor 86. NOR gate 96 is controlled by the source off line (VPXG2OFFB) 54 and the second voltage node (VV2) 104. During operation, the output of NOR gate 96 activates n-channel transistor 86 to complete the current path for low threshold n-channel transistor 92 and p-channel transistor 80. As illustrated in FIG. 3, the second voltage node (VV2) 104 is located between the gates of low threshold n-channel transistors 90, 92. As previously set forth, the source off line (VPXG2OFFB) 54 is controlled by the state machine and is used as a control input to NOR gate 96.

The wordline driver circuit 16 thus acts as a high-speed buffer that charges the wordlines 18 to a voltage level of approximately 82 percent of the value of the supply voltage (Vcc) within 10 nanoseconds when the chip enters read mode. This protects the core cells in the wordlines 18 from seeing a voltage high enough to disturb the data stored in the core cells or cause data retention failure through charge gain. As set forth above, due to the decrease in cell sizes realized by the implementation 0.25 $\mu$m process technology, the voltage levels applied to the wordlines 18 during read mode need to be reduced. The present invention discloses methods and systems of reducing the supply voltage (Vcc) level with a high-speed wordline driver circuit 16 before the voltage necessary to read the core cells in the wordlines 18 is applied to the wordlines 18.

While the invention has been described in its currently best known modes of operation and embodiments, other modes and embodiments of the invention will be apparent to those skilled in the art and it is the following claims, including all equivalents, that are intended to define the spirit and scope of the invention.

What is claimed is:

1. A method of supplying a predetermined read voltage when a memory device is in read mode, comprising:

generating a plurality of control signals with an activation circuit;

directing said control signals to a wordline driver circuit;

generating a predetermined read voltage with said wordline driver circuit in response to said control signals, wherein said wordline driver circuit generates said predetermined read voltage using a chain of resistors and a current mirror;

reducing said predetermined read voltage to a predetermined voltage level from the magnitude of voltage present from a supply voltage connection with said wordline driver circuit; and supplying said predetermined read voltage to at least one wordline.

2. The method of claim 1, wherein said wordline driver circuit adjusts said predetermined read voltage based on variations in the operating temperature of said memory device.

3. The method of claim 1, wherein said wordline driver circuit adjusts for variations in a voltage level on said supply voltage connection to maintain said predetermined read voltage.

4. The method of claim 1, wherein said wordline driver circuit adjusts for variations in load on said memory device to maintain said predetermined read voltage.

5. The method of claim 1, wherein said predetermined read voltage is maintained between approximately 3.7–4.5 V when the voltage level on said supply voltage connection is between approximately 4.5–5.5 V.

6. The method of claim 1, wherein said wordline driver circuit regulates the voltage on said supply voltage connection to said predetermined read voltage within ten nanoseconds of activation by said activation circuit.

7. A method of regulating a supply voltage in a memory device operating in read mode, comprising:

supplying said supply voltage to a wordline driver circuit within said memory device;

activating said wordline driver circuit with an activation circuit when said memory device is in read mode;

regulating said supply voltage to a predetermined read voltage with said wordline driver circuit, wherein said wordline driver circuit reduces said supply voltage with a chain of resistors and a current mirror; and supplying said predetermined read voltage to at least one wordline in said memory device.

8. The method of claim 7, wherein said wordline driver circuit reduces said supply voltage to a predetermined voltage level to create said predetermined read voltage.

9. The method of claim 7, wherein said wordline driver circuit adjusts said predetermined read voltage to compensate for variations in the operating temperature of said memory device.

10. The method of claim 7, wherein said wordline driver circuit adjusts for variations in said supply voltage to maintain said predetermined read voltage.

11. The method of claim 7, wherein said wordline driver circuit adjusts for variation in a process load on said wordline driver circuit to maintain said predetermined read voltage.

12. The method of claim 7, wherein said predetermined read voltage is regulated between approximately 3.7–4.5 V when said supply voltage is between approximately 4.5–5.5 V.

13. The method of claim 7, wherein said wordline driver circuit can regulate said supply voltage to said predetermined voltage within ten nanoseconds of activation by said activation circuit.

14. A wordline voltage regulation system for use during read mode in a flash memory device, comprising:

an activation circuit electrically connected with a state machine, wherein said state machine controls said activation circuit;

a wordline driver circuit electrically connected to said activation circuit, wherein said wordline driver circuit regulates the voltage on a supply voltage connection to a predetermined read voltage in response to a signal from said activation circuit, wherein said wordline driver circuit includes a chain of resistors and a current mirror; and at least one wordline electrically connected with said wordline driver circuit, wherein said predetermined read voltage is applied to said at least one wordline during read mode.

15. The wordline voltage regulation system of claim 14, wherein said wordline driver circuit regulates the voltage on said supply voltage connection by reducing the voltage on said supply voltage connection.

16. The wordline voltage regulation system of claim 15, wherein said voltage on said supply voltage connection is reduced to approximately 3.7–4.5 V when said supply voltage varies from approximately 4.5–5.5 V.

17. The wordline voltage regulation system of claim 14, wherein said wordline driver circuit regulates said voltage on said supply voltage connection to said predetermined read voltage within ten nanoseconds of activation by the activation circuit.

* * * * *